(12) United States Patent
Hirabayashi et al.

(10) Patent No.: US 9,385,188 B2
(45) Date of Patent: Jul. 5, 2016

(54) SEMICONDUCTOR DEVICE WITH TERMINATION REGION HAVING FLOATING ELECTRODES IN AN INSULATING LAYER

(71) Applicants: Yasuhiro Hirabayashi, Toyota (JP); Akinori Sakakibara, Toyota (JP)

(72) Inventors: Yasuhiro Hirabayashi, Toyota (JP); Akinori Sakakibara, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 23 days.

(21) Appl. No.: 14/372,103

(22) PCT Filed: Nov. 27, 2012

(86) PCT No.: PCT/JP2012/080624
§ 371 (c)(1),
(2) Date: Jul. 14, 2014

(87) PCT Pub. No.: WO2013/105350
PCT Pub. Date: Jul. 18, 2013

(65) Prior Publication Data
US 2014/0374871 A1 Dec. 25, 2014

(30) Foreign Application Priority Data
Jan. 12, 2012 (JP) .................................. 2012-003877

(51) Int. Cl.
*H01L 29/06* (2006.01)
*H01L 29/40* (2006.01)
(Continued)

(52) U.S. Cl.
CPC ............ *H01L 29/063* (2013.01); *H01L 29/404* (2013.01); *H01L 29/407* (2013.01);
(Continued)

(58) Field of Classification Search
CPC ... H01L 29/063; H01L 29/407; H01L 29/404; H01L 29/66348; H01L 29/7397; H01L 29/7811; H01L 29/7813; H01L 29/0615; H01L 29/0619; H01L 29/0638

USPC .......................................... 257/488; 438/454
See application file for complete search history.

(56) References Cited

U.S. PATENT DOCUMENTS

| 5,607,718 A | 3/1997 | Sasaki et al. |
| 7,368,785 B2 * | 5/2008 | Chen et al. ..................... 257/341 |

(Continued)

FOREIGN PATENT DOCUMENTS

| CN | 101414635 A | 4/2009 |
| JP | A-2001-111034 | 4/2001 |

(Continued)

OTHER PUBLICATIONS

Feb. 17, 2015 Search Report issued in European Application No. 12865395.3.

*Primary Examiner* — Peter Bradford
(74) *Attorney, Agent, or Firm* — Oliff PLC

(57) ABSTRACT

A semiconductor device which can suppress the influence of the external electric charge and can be efficiently manufactured is provided. The semiconductor device is provided with an active region in which a semiconductor element is disposed and a termination region between the active region and an edge surface of the semiconductor substrate. An insulating layer is disposed on at least a part of an upper surface of the termination region. A plurality of floating electrodes is disposed at an interval in the insulating layer in a direction from the active region toward the edge surface of the semiconductor substrate, and a width of the plurality of floating electrodes in a thickness direction of the semiconductor substrate is greater than a width of the plurality of floating electrodes in the direction from the active region toward the edge surface of the semiconductor substrate.

2 Claims, 15 Drawing Sheets

(51) Int. Cl.
  *H01L 29/66* (2006.01)
  *H01L 29/739* (2006.01)
  *H01L 29/78* (2006.01)

(52) U.S. Cl.
  CPC ...... *H01L29/66348* (2013.01); *H01L 29/7397* (2013.01); *H01L 29/7811* (2013.01); *H01L 29/7813* (2013.01); H01L 29/0615 (2013.01); H01L 29/0619 (2013.01); H01L 29/0638 (2013.01)

(56) References Cited

U.S. PATENT DOCUMENTS

| | | | |
|---|---|---|---|
| 8,476,732 B2* | 7/2013 | Senoo | 257/488 |
| 2005/0161761 A1 | 7/2005 | Hatade | |
| 2007/0052014 A1 | 3/2007 | Takahashi | |
| 2008/0179671 A1 | 7/2008 | Saito et al. | |
| 2008/0315343 A1* | 12/2008 | Kitagawa | 257/488 |
| 2009/0194786 A1* | 8/2009 | Iwamoto et al. | 257/139 |
| 2010/0187603 A1 | 7/2010 | Hanaoka | |
| 2010/0252904 A1 | 10/2010 | Takahashi et al. | |
| 2010/0264507 A1 | 10/2010 | Takahashi et al. | |
| 2011/0073903 A1 | 3/2011 | Yoshikawa et al. | |
| 2011/0115033 A1* | 5/2011 | Tamaki | H01L 29/7395 257/409 |
| 2011/0241110 A1 | 10/2011 | Xiao et al. | |

FOREIGN PATENT DOCUMENTS

| | | |
|---|---|---|
| JP | A-2003-188381 | 7/2003 |
| JP | A-2005-209983 | 8/2005 |
| JP | A-2007-59766 | 3/2007 |
| JP | A-2008-187125 | 8/2008 |
| JP | 2009-032728 A | 2/2009 |
| JP | A-2010-245281 | 10/2010 |
| JP | A-2011-40773 | 2/2011 |
| JP | A-2011-77202 | 4/2011 |

* cited by examiner

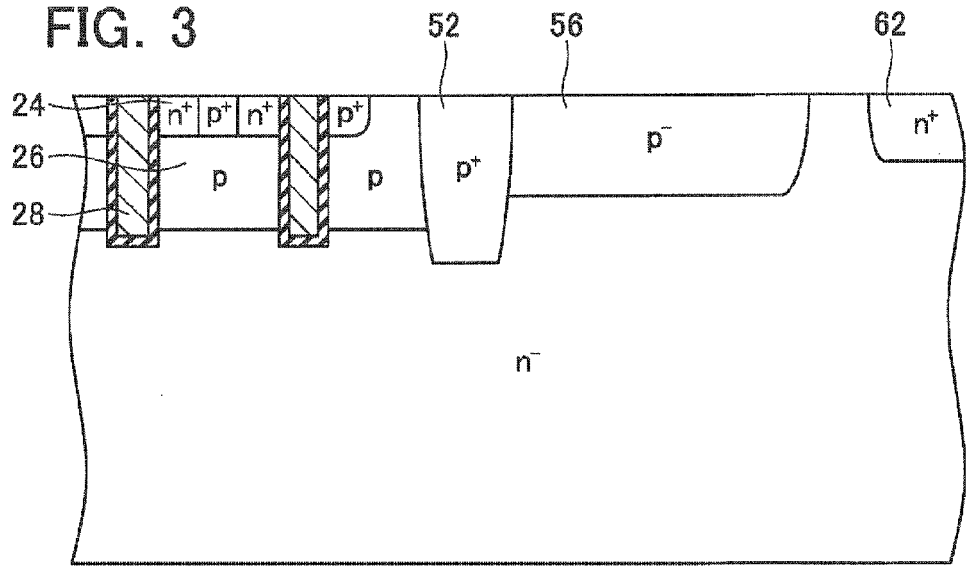
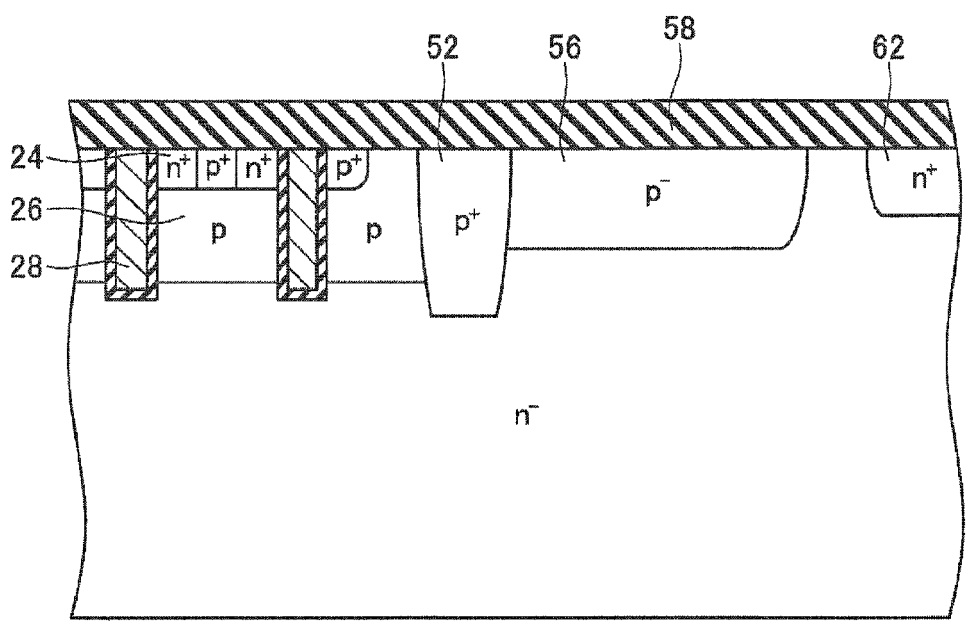

SEMICONDUCTOR DEVICE WITH TERMINATION REGION HAVING FLOATING ELECTRODES IN AN INSULATING LAYER

TECHNICAL FIELD

A technology disclosed by the present description relates to a structure of a termination region of a semiconductor device.

BACKGROUND ART

Japanese Patent Application Publication No. 2005-209983 discloses a semiconductor device including an termination region between an active region in which a semiconductor element is disposed and an edge surface of a semiconductor substrate. An insulating layer is disposed on an upper part of the termination region. External electric charges (ions flying from an outside and the like, for example) might adhere to a surface of the insulating layer on the upper part of the termination region. If an electric field in a semiconductor layer of the termination region is disturbed by an influence of the electric field of the external electric charges, a locally high electric field is generated, and stress is applied to the semiconductor device. However, this semiconductor device has a plurality of floating electrodes inside the insulating layer. The influence of the electric field of the external electric charges into the semiconductor layer of the termination region can be suppressed by the floating electrodes.

SUMMARY OF INVENTION

Technical Problem

In the above described conventional semiconductor device, floating electrodes are disposed so as to constitute two layers on the insulating layer on the upper part of the termination region. The floating electrode on a lower layer is disposed so as to partially overlap with the floating electrode on an upper layer. As a result, a high capacitance is ensured between each of the floating electrodes. A charge amount accumulated in a capacitor between each of the floating electrodes is increased by raising the capacitance between the floating electrodes as above. As a result, the influence of the electric field of the external electric charges on the semiconductor layer in the termination region can be reduced. However, in order to form the floating electrodes so as to constitute the two layers, it is required to grow a metal layer and the insulating layer as well as to pattern each layer several times, and the number of manufacturing processes of the semiconductor device increases. Thus, the conventional semiconductor device has a problem that its manufacturing efficiency is poor. Therefore, in this description, a semiconductor device which can suppress the influence of the external electric charges and can be efficiently manufactured is provided.

Solution to Technical Problem

A semiconductor device disclosed in the present description comprises a semiconductor substrate. The semiconductor substrate includes an active region in which a semiconductor element is disposed and a termination region between the active region and an edge surface of the semiconductor substrate. An insulating layer is disposed on at least a part of an upper surface of the termination region. A plurality of floating electrodes is disposed at an interval in the insulating layer in a direction from the active region toward the edge surface of the semiconductor substrate, and a width of the plurality of floating electrodes in a thickness direction of the semiconductor substrate is greater than a width of the plurality of floating electrodes in the direction from the active region toward the edge surface of the semiconductor substrate.

In this semiconductor device, each of the floating electrodes extends long in the thickness direction of the semiconductor substrate. Moreover, each of the floating electrodes is disposed at an interval in the direction from the active region toward the edge surface of the semiconductor substrate. Therefore, a wider surface of each of the floating electrodes is faced with each other in the direction from the active region toward the edge surface of the semiconductor substrate. Thus, a capacitance of a capacitor constituted by each of the floating electrodes is high. That is, one layer of floating electrodes can ensure a high capacitance. Therefore, this semiconductor device can effectively suppress the influence of the electric field of the external electric charges. Moreover, since the floating electrodes are constituted as one layer, this semiconductor device can be efficiently manufactured.

Moreover, the present description provides a method for manufacturing a semiconductor device. The method comprises forming an insulating layer on a termination region of a semiconductor substrate, the termination region being between an active region in which a semiconductor element is formed and a part which is to be an edge surface of the semiconductor device, and forming a plurality of trenches at an interval in the insulating layer along a direction from the active region toward the part which is to be the edge surface of the semiconductor device, wherein a width of the plurality of trenches in a thickness direction of the semiconductor substrate is greater than a width of the plurality of trenches in the direction from the active region toward the part which is to be the edge surface of the semiconductor substrate, and forming a metal layer on the insulating layer, and etching the metal layer in a state where the metal layer above the plurality of trenches is not masked, such that the metal layer in each trench remains, and the metal layers in the respective trenches are separated from each other.

In forming the metal layer on the insulating layer, the metal layer is formed also in the trenches. In etching the metal layer, the metal layer outside the trenches is removed such that the metal layers in the trenches remains. As a result, the metal layer in each trench is separated from each other. During etching, since a width of the trenches is small, an etching speed of the metal layers in the trenches becomes extremely slow. Thus, the metal layers can be easily made to remain in the trenches. The plurality of metal layers remaining in the trenches becomes the plurality of floating electrodes having the width in the thickness direction of the semiconductor substrate greater than the width in the direction from the active region toward the edge surface of the semiconductor substrate, and is disposed at an interval along the direction from the active region toward the edge surface of the semiconductor substrate. Therefore, according to this manufacturing method, the semiconductor device having the termination region less susceptible to the influence of the external electric charges can be manufactured. Moreover, in this manufacturing method, it is only necessary to form one layer of the floating electrodes, and the floating electrodes can be easily formed as described above. Therefore, according to this manufacturing method, the semiconductor device can be efficiently manufactured.

BRIEF DESCRIPTION OF DRAWINGS

FIG. 3 is a longitudinal sectional view of a semiconductor wafer illustrating a manufacturing process of the semiconductor device 10;

FIG. 4 is a longitudinal sectional view of the semiconductor wafer illustrating the manufacturing process of the semiconductor device 10;

DESCRIPTION OF EMBODIMENTS

Figure 1:
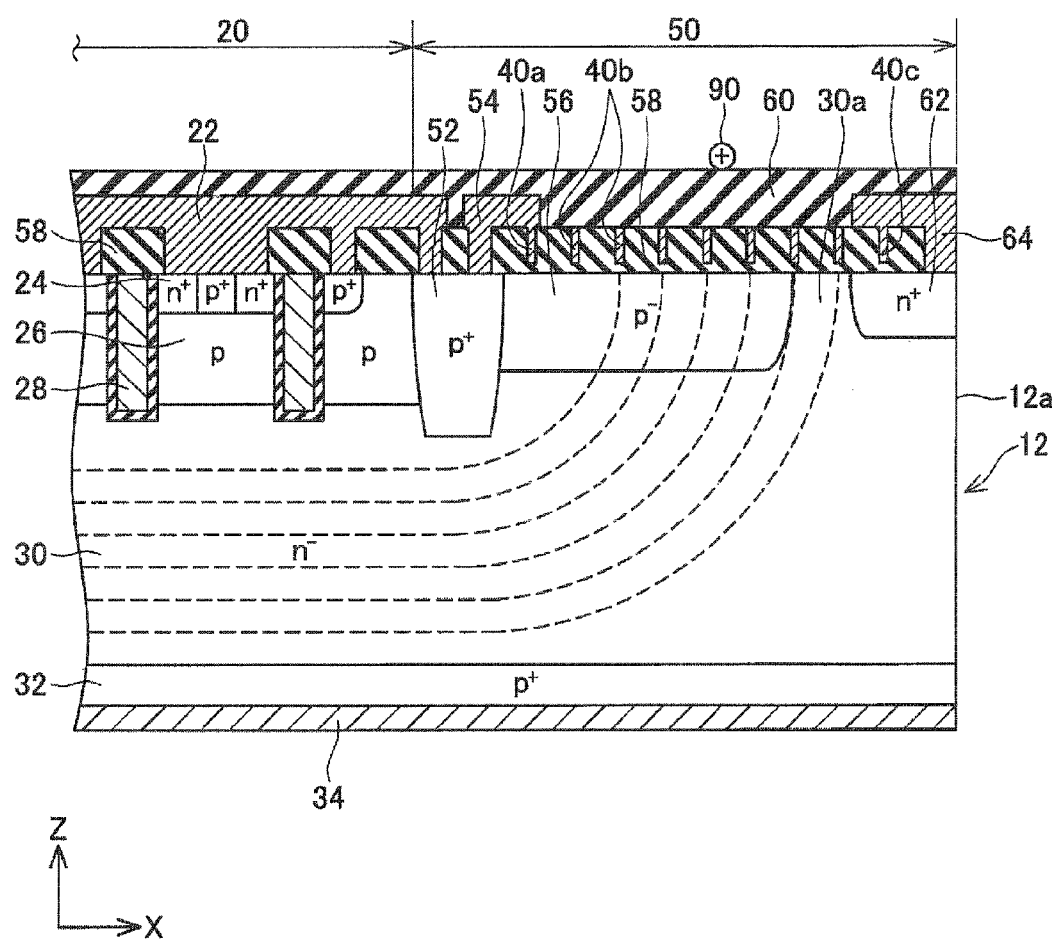
FIG. 1 is a longitudinal sectional view of a semiconductor device 10.

Specific features of embodiments and variations will be listed below. It should be noted that technical features described below are independent from each other, and may technically be useful alone or in various combinations, and are not limited to the combinations as originally claimed.

In the semiconductor device disclosed in the present description, the floating electrodes which are disposed in the insulating layer may be exposed at at least one of an upper surface and a lower surface of the insulating layer. If the floating electrodes are exposed at the upper surface of the insulating layer, the floating electrodes do not have to be embedded in the insulating layer and thus, the floating electrodes can be formed easily. If the floating electrodes are exposed on the lower surface of the insulating layer, a movement of external electric charges on the lower surface side of the insulating layer can be physically shut off.

In the semiconductor device disclosed in the present description, at least one of the floating electrodes may be present on an arbitrary line extending from the active region toward the edge surface of the semiconductor substrate on an arbitrary cross section of the insulating layer in a plane perpendicular to the thickness direction. According to this configuration, a movement of the external electric charges within the insulating layer is suppressed, and generation of local concentration of the external electric charges can be suppressed.

In the semiconductor device disclosed in the present description, the floating electrodes may be exposed at an upper surface of the insulating layer but may not be exposed at a lower surface of the insulating layer. According to this configuration, a semiconductor region is prevented from being etched when the floating electrodes are formed.

In the semiconductor device disclosed in the present description, the floating electrodes may be exposed at both an upper surface and a lower surface of the insulating layer. According to this configuration, a region between the adjacent floating electrodes in the insulating layer becomes a closed space in the direction from the active region toward the edge surface of the semiconductor substrate and thus, the external electric charges and movable ions present in the insulating layer can move only within the closed space. That is, the movement of the external electric charges and movable ions can be physically shut off.

In the semiconductor device disclosed in the present description, the plurality of floating electrodes which is disposed in the insulating layer may include first floating electrodes which are exposed at an upper surface of the insulating layer and second floating electrodes which are exposed at a lower surface of the insulating layer, wherein the first floating electrodes and the second floating electrodes may be alternately disposed. According to this configuration, the wider surfaces of the first floating electrode and the second floating electrode are faced with each other. Thus, the capacitance of the capacitor constituted by the first floating electrode and the second floating electrode becomes high, and a charge amount accumulated in each of the capacitors increases. Therefore, the influence of the electric field of the external electric charges and movable ions can be effectively suppressed.

In the semiconductor device disclosed in the present description, in a cross section of the floating electrodes in a plane perpendicular to a longitudinal direction of the floating electrodes, corners of the floating electrodes, each of which is formed by a lower surface and a lateral surface of each of the floating electrodes, may be curved. In general, if the corners in the above-described cross section of the floating electrode are substantially right-angled (that is, the cross section has a rectangular shape), the electric field can easily concentrate on these substantially right-angled corners. Thus, by making the corners curved, the concentration of the electric field on the corners is suppressed, and a drop of a withstand voltage can be effectively suppressed.

Moreover, regarding the method for manufacturing the semiconductor device disclosed in the present description, it is preferable to form the insulating layer also on the active region in the forming of the insulating layer. Moreover, it is preferable that the method further comprises forming a contact hole in the insulating layer on the active region, which is performed prior to the forming of the metal layer. Moreover, it is preferable that the metal layer is formed also in the contact hole in the forming of the metal layer, and that the etching of the metal layer is performed in a state of masking the metal layer on the contact hole. According to such configuration, not only the floating electrode but also an electrode electrically conducted with the active region via the contact hole can be formed by the above-described metal layer. Therefore, the semiconductor device can be manufactured more efficiently.

In the method for manufacturing the semiconductor device disclosed in the present description, the forming of the plurality of trenches and the forming of the contact hole may be performed by a common etching. According to such configuration, the semiconductor device can be manufactured more efficiently.

First Embodiment

A semiconductor device 10 illustrated in FIG. 1 includes a semiconductor substrate 12, electrodes formed on an upper surface and a lower surface of the semiconductor substrate 12, and an insulating layer and the like. The semiconductor substrate 12 has an active region 20 and a termination region 50. An IGBT is formed in the active region 20. The active region 20 is formed substantially at a center part of the semiconductor substrate 12 when the semiconductor substrate 12 is seen from the upper surface side. The termination region 50 is a region between the active region 20 and an edge surface (outer peripheral surface) 12a of the semiconductor substrate 12. Therefore, when the semiconductor substrate 12 is seen in a plan view from above, the active region 20 is surrounded by the termination region 50.

A trench is formed on the upper surface of the active region 20. An inner surface of the trench is covered by a gate insulating film. A gate electrode 28 is formed in the trench. An upper surface of the gate electrode 28 is covered by an insulating layer 58. An emitter electrode 22 is formed on an upper surface of the active region 20. The emitter electrode 22 is insulated by the insulating layer 58 from the gate electrode 28. A collector electrode 34 is formed on a lower surface of the semiconductor substrate 12.

An n-type emitter region 24, a p-type body region 26, an n-type drift region 30, and a p-type collector region 32 are formed in the active region 20. The emitter region 24 is formed in a range exposed on the upper surface of the semiconductor substrate 12. The emitter region 24 is formed in a range in contact with the gate insulating film. The emitter region 24 is ohmically connected to the emitter electrode 22. The body region 26 is formed on a lateral side of the emitter region 24 and on a lower side of the emitter region 24. The body region 26 is in contact with the gate insulating film on the lower side of the emitter region 24. The body region 26 between the two emitter regions 24 has high p-type impurity concentration and is ohmically connected to the emitter electrode 22. The drift region 30 is formed on the lower side of the body region 26. The drift region 30 is separated from the emitter region 24 by the body region 26. The drift region 30 is in contact with the gate insulating film on a lower end portion of the trench. The collector region 32 is formed on the lower side of the drift region 30. The collector region 32 has high p-type impurity concentration and is ohmically connected to the collector electrode 34. The IGBT is formed in the active region 20 by each of the above-described electrodes and semiconductor regions.

A deep p-type region 52, a resurf region 56, and an end-portion n-type region 62 are formed in the termination region 50. The deep p-type region 52 is located on a boundary between the active region 20 and the termination region 50. The deep p-type region 52 is formed in a range exposed on the upper surface of the semiconductor substrate 12. The deep p-type region 52 is in contact with the body region 26. The deep p-type region 52 is formed to a depth deeper than the gate electrode 28 in the active region 20. The deep p-type region 52 has p-type impurities at high concentration and is ohmically connected to the electrodes 22 and 54 formed on the deep p-type region 52. The resurf region 56 is adjacent to the deep p-type region 52. The resurf region 56 is formed in a range exposed on the upper surface of the semiconductor substrate 12. The resurf region 56 is formed in a range shallower than the deep p-type region 52. The p-type impurity concentration of the resurf region 56 is lower than that of the deep p-type region 52. Moreover, the p-type impurity concentration of the resurf region 56 is lower than n-type impurity concentration of the end-portion n-type region 62. The end-portion n-type region 62 is formed in a range exposed on the edge surface 12a of the semiconductor substrate 12 and exposed on the upper surface of the semiconductor substrate 12. The end-portion n-type region 62 contains n-type impurities at relatively high concentration and is ohmically connected to an electrode 64 formed on the end-portion n-type region 62. The above-described drift region 30 is formed on lower sides of the deep p-type region 52, the resurf region 56, and the end-portion n-type region 62. That is, the drift region 30 spreads from the active region 20 to the termination region 50. Moreover, the drift region 30 is also present in a range between the resurf region 56 and the end-portion n-type region 62 and is exposed on the upper surface of the semiconductor substrate 12 within that range. In the following, the drift region 30 between the resurf region 56 and the end-portion n-type region 62 is called a peripheral drift region 30a. The n-type impurity concentration of the drift region 30 is lower than the p-type impurity concentration of the deep p-type region 52 and lower than the n-type impurity concentration of the end-portion n-type region 62. The collector region 32 is formed on a lower side of the drift region 30 also in the termination region 50.

Figure 2:
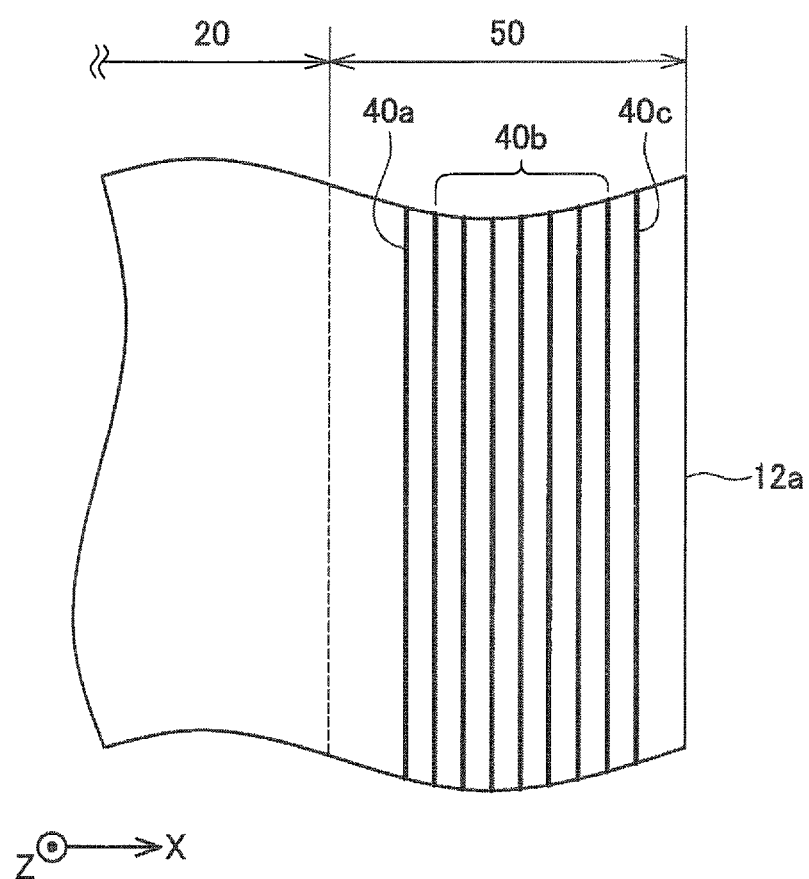
FIG. 2 is a view illustrating arrangement of an active region 20, a termination region 50, and trench electrodes 40a-40c when the semiconductor device 10 is seen from an upper surface side.

The insulating layer 58, an insulating layer 60, and a plurality of trench electrodes 40 (40a-40c) are formed on the termination region 50. It should be noted that, in FIG. 1, for ease of understanding of the figure, the insulating layer 58 is illustrated thicker than actual. The insulating layer 58 is formed in a range in contact with the upper surface of the semiconductor substrate 12. The insulating layer 58 is composed of $SiO_2$. The insulating layer 58 covers upper surfaces of the resurf region 56 and the peripheral drift region 30a. Moreover, the insulating layer 58 is formed also on the other regions (on the gate electrode 28 in the active region 20 and the like). The plurality of trench electrodes 40 are formed in the insulating layer 58. It should be noted that a cross section in FIG. 1 is a cross section along a direction from the active region 20 toward the edge surface 12a of the semiconductor substrate 12 (that is, an X-direction) and along a thickness direction of the semiconductor substrate 12 (that is, a Z-direction). In this cross section, each of the trench electrodes 40 extends along the thickness direction of the semiconductor substrate 12. That is, each of the trench electrodes 40 has a width in the Z-direction greater than a width in the X-direction. Moreover, as illustrated in FIG. 2, when the semiconductor substrate 12 is seen from the upper surface side, each of the trench electrodes 40 is formed so as to extend along the edge surface 12a of the semiconductor substrate 12 and to go around the active region 20. The trench electrodes 40 are arranged at intervals along the direction from the active region 20 toward the edge surface 12a of the semiconductor substrate 12. Therefore, the wider surface of each of the trench electrodes 40 is faced with the wider surface of another trench electrode 40. Thus, a capacitance between each of the trench electrodes 40 (that is, a capacitance of a capacitor formed of a pair of the adjacent trench electrodes 40) is large. Each of the trench electrodes 40 is arranged substantially at an equal interval. Each of the trench electrodes 40 is electrically separated from each other. As illustrated in FIG. 1, the trench electrode 40a on a side the closest to the active region 20 is connected to the electrode 54. The trench electrode 40c on a side the closest to the edge surface 12a is connected to the electrode 64. The other trench electrodes 40b are not connected to other electrodes. Thus, a potential of each of the trench electrodes 40b is varied in accordance with potential distribution around it. That is, the trench electrodes 40b are floating electrodes. The insulating layer 60 is composed of SiN and covers upper parts of the insulating layer 60 and each of the electrodes. Therefore, the upper surface of each of the trench electrodes 40 is covered by the insulating layer 60.

When the IGBT in the active region 20 is turned off, a high voltage $V_{ce}$ is applied between the collector electrode 34 and the emitter electrode 22. At this time, the end-portion n-type region 62 has substantially the same potential as that of the collector electrode 34. Moreover, the deep p-type region 52 has substantially the same potential as that of the emitter electrode 22. Therefore, a voltage V1 substantially equal to the voltage $V_{ce}$ is applied between the end-portion n-type region 62 and the deep p-type region 52. Then, a depletion layer spreads from the deep p-type region 52 toward the end-portion n-type region 62. The resurf region 56 promotes this extension of the depletion layer. Thus, the depletion layer spreads over substantially the whole regions of the resurf region 56 and the peripheral drift region 30a. Insulation properties between the end-portion n-type region 62 and the deep p-type region 52 are ensured by the depletion layer spreading as above. Thus, in a state in which the IGBT is off, equipotential lines are distributed in the semiconductor substrate 12 as indicated by dot lines in FIG. 1.

As described above, the trench electrode 40a is connected to the deep p-type region 52 via the electrode 54. Moreover, the trench electrode 40c is connected to the end-portion n-type region 62 via the electrode 64. Therefore, the voltage substantially equal to the voltage V1 between the end-portion n-type region 62 and the deep p-type region 52 is applied between the trench electrode 40a and the trench electrode 40c. The plurality of trench electrodes 40b is present inside the insulating layer 58 between the trench electrode 40a and the trench electrode 40c. Thus, a voltage obtained by dividing the voltage V1 is applied between these trench electrodes 40. Since each of the trench electrodes 40 is arranged substantially at an equal interval, each potential difference between the trench electrodes 40 becomes substantially equal to each other. Thus, as illustrated in FIG. 1, the equipotential lines are distributed substantially at an equal interval in the termination region 50. Therefore, an electric field in the resurf region 56 and the peripheral drift region 30a is made uniform, and generation of a locally high electric field is suppressed.

Moreover, as illustrated in FIG. 1, external electric charges 90 (movable ions such as Na, Cu, Cl and the like, for example) might adhere to the surface of the termination region 50. If the electric field in the termination region 50 is disturbed by an electric field generated by the external electric charges 90, electric field concentration occurs in the termination region 50. However, in the semiconductor device 10 of this embodiment, the plurality of trench electrodes 40 is formed in the insulating layer 58 on the surface of the termination region 50. Each capacitor formed of each of the trench electrodes 40 accumulates electric charges by voltage applied thereto. The electric field generated by the electric charges accumulated in each capacitor suppresses an influence of the electric field from the external electric charges 90 on the resurf region 56 and the peripheral drift region 30a. Particularly, since each of the trench electrodes 40 is arranged so that the wider surfaces thereof are faced with each other as described above, the capacitance of each of the above-described capacitors is large. Thus, the electric charge amount accumulated by each capacitor is large. Moreover, the external electric charges are moved to either one of the trench electrodes 40 by the electric field generated between the trench electrodes 40 and are fixed thereto. Thus, the influence of the electric field from the external electric charges 90 on the resurf region 56 and the peripheral drift region 30a is suppressed more effectively. Therefore, in this semiconductor device 10, generation of the locally high electric field in the termination region 50 caused by adhesion of the external electric charges 90 can be effectively suppressed. Thus, the semiconductor device 10 has excellent withstand voltage properties.

Subsequently, a method for manufacturing of the semiconductor device 10 will be explained. When the semiconductor device 10 is to be manufactured, first, as illustrated in FIG. 3, each of the semiconductor layers (the emitter region 24, the body region 26, the deep p-type region 52, the resurf region 56, the end-portion n-type region 62), the gate electrode 28, and the gate insulating film are formed on the upper surface side of the n-type semiconductor wafer. They are formed by a known method.

Figure 5:
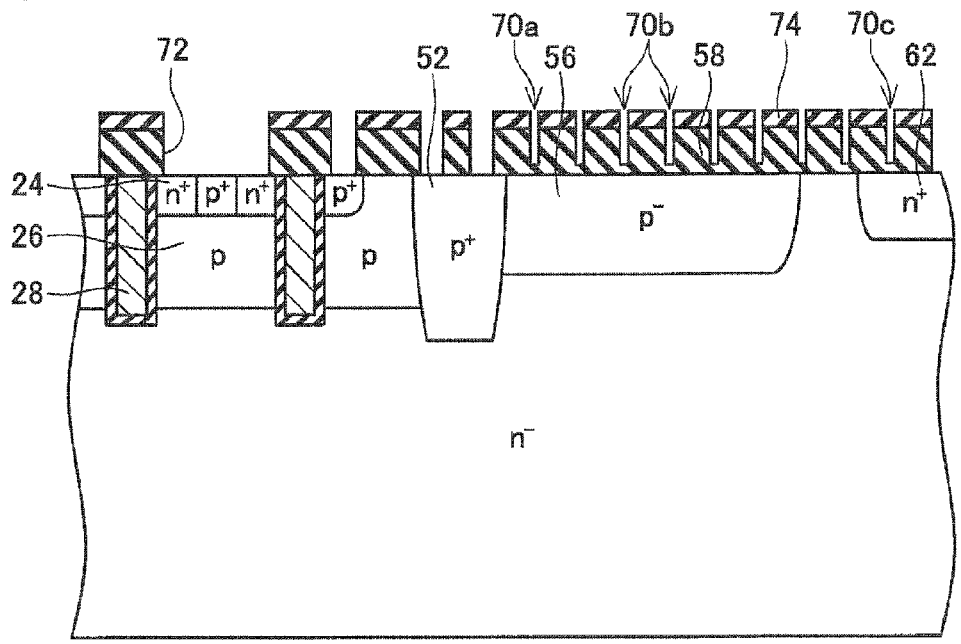
FIG. 5 is a longitudinal sectional view of the semiconductor wafer illustrating the manufacturing process of the semiconductor device 10.

Subsequently, as illustrated in FIG. 4, the insulating layer 58 (SiO$_2$ layer) is formed on the whole upper surface of the semiconductor wafer. Subsequently, in a state in which a mask 74 is provided on the insulating layer 58 as illustrated in FIG. 5, the insulating layer 58 is etched by RIE or dry etching. As a result, trenches 70 (trenches 70a-70c) and contact holes 72 are formed. It should be noted that the trench 70a is a trench in which the trench electrode 40a is formed, the trenches 70b are trenches in which the trench electrodes 40b are formed, and the trench 70c is a trench in which the trench electrode 40c is formed. The trenches 70 are formed so as not to reach the semiconductor layer (that is, the insulating layer 58 remains on the lower side of bottom surfaces of the trenches 70). The contact holes 72 are holes for connecting the electrodes 22, 54, 64 and the like to the semiconductor layer. The contact holes 72 are formed so as to reach the semiconductor layer. A width of the trench 70 is smaller than that of the contact hole 72. Therefore, an etching speed in a region in which the trenches 70 are formed is lower than the etching speed in a region in which the contact holes 72 are formed. Therefore, the trenches 70 which do not reach the semiconductor layer and the contact holes 72 which reach the semiconductor layer can be formed by etching once. After the trenches 70 and the contact holes 72 are formed, the mask 74 is removed.

Figure 6:
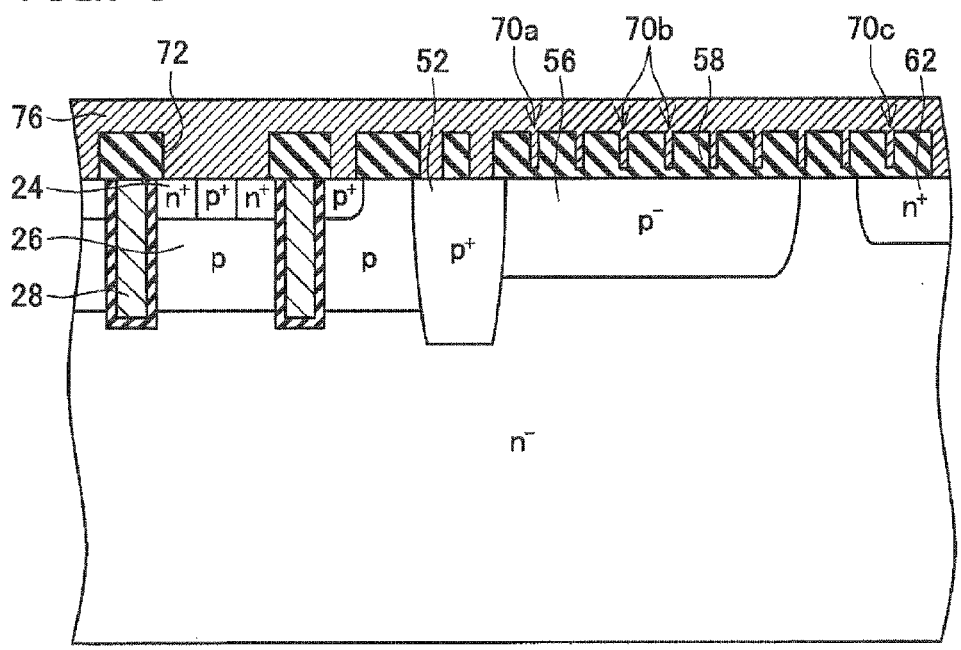
FIG. 6 is a longitudinal sectional view of the semiconductor wafer illustrating the manufacturing process of the semiconductor device 10.

Subsequently, a metal layer 76 is formed on the semiconductor wafer by sputtering or the like as illustrated in FIG. 6. At this time, the metal layer 76 is also filled in the trenches 70 and the contact holes 72. Moreover, here, an upper surface of the metal layer 76 is made substantially flat by forming the metal layer 76 thick.

Figure 7:
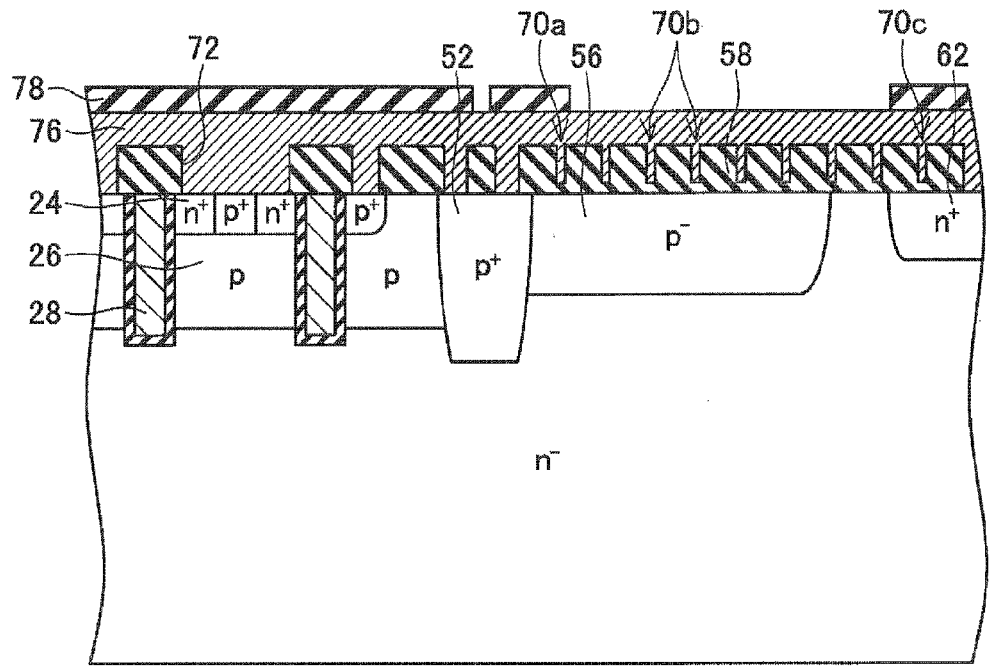
FIG. 7 is a longitudinal sectional view of the semiconductor wafer illustrating the manufacturing process of the semiconductor device 10.
Figure 8:
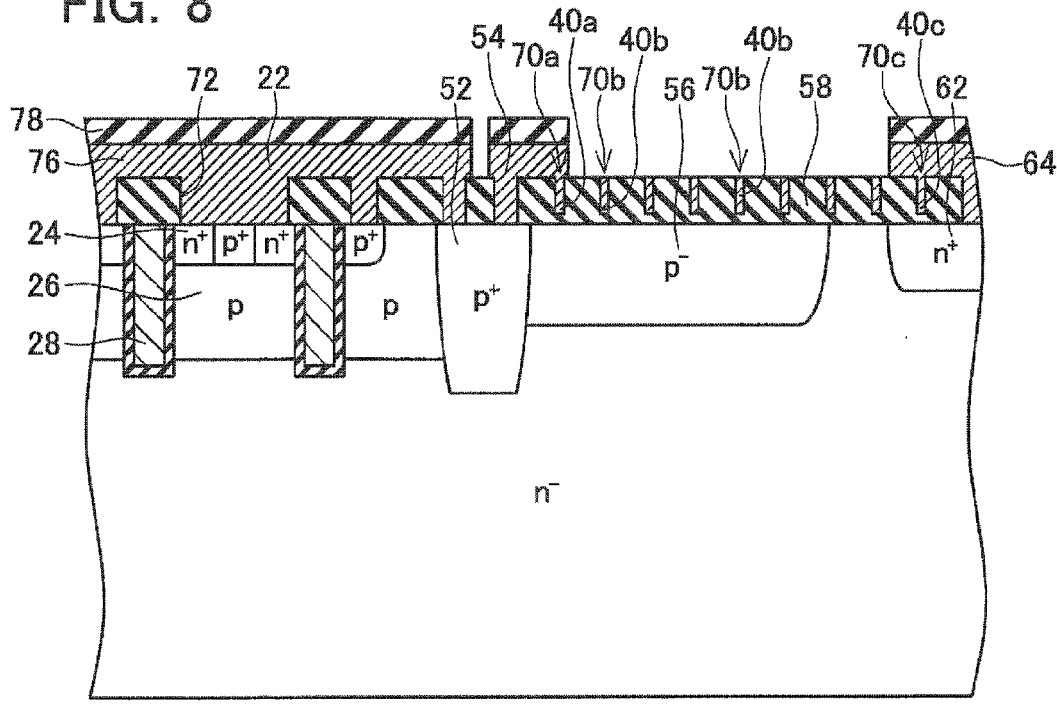
FIG. 8 is a longitudinal sectional view of the semiconductor wafer illustrating the manufacturing process of the semiconductor device 10.

Subsequently, as illustrated in FIG. 7, a mask 78 is formed on the surface of the metal layer 76 to be made to remain as electrodes 22, 54, 64 and the like. It should be noted that, here, the mask 78 is not formed on the surface of the metal layer 76 on the trenches 70b. Subsequently, the metal layer 76 is etched so as to pattern the metal layer 76 as illustrated in FIG. 8. As a result, the emitter electrode 22, the electrode 54, and the electrode 64 are formed. The metal layer 76 in the trench 70a becomes the trench electrode 40a, and the metal layer 76 in the trench 70c becomes the trench electrode 40c. Moreover, at this time, the metal layer 76 on the insulating layer 58 in a range on which the mask 78 is not formed is removed and also, etching is performed so that the metal layer 76 remains in the trenches 70b. Since the width of the trenches 70b is small, the etching speed in the trenches 70b becomes extremely slow. Therefore, the metal layer 76 can be made to easily remain in the trenches 70b. As a result, the metal layer 76 in the each trench 70b is separated from each other, and the trench electrode 40b is formed.

Subsequently, the insulating layer 60 (SiN layer) is formed on the semiconductor wafer. As a result, a structure on the upper surface side of the semiconductor device 10 is completed. After that, a structure on the lower surface side (the collector region 32, the collector electrode 34) is formed by a known method of prior-art. After that, the semiconductor device 10 illustrated in FIG. 1 is completed by dicing the semiconductor wafer.

As described above, in this manufacturing method, when the contact holes 72 are formed in the insulating layer 58, the trenches 70 are formed at the same time. Moreover, in this method for manufacturing, the trench electrodes 40 are formed with the other electrodes by the metal layer 76. Moreover, in this manufacturing method, when each electrode is formed by patterning the metal layer 76, the metal layer 76 in each trench 70b is separated from each other at the same time so as to form the trench electrode 40b. As described above, according to this manufacturing method, the trench electrodes 40 can be formed without adding an extra process for forming the trench electrodes 40. Therefore, the semiconductor device 10 having the trench electrodes 40 can be manufactured extremely efficiently.

Figure 9:
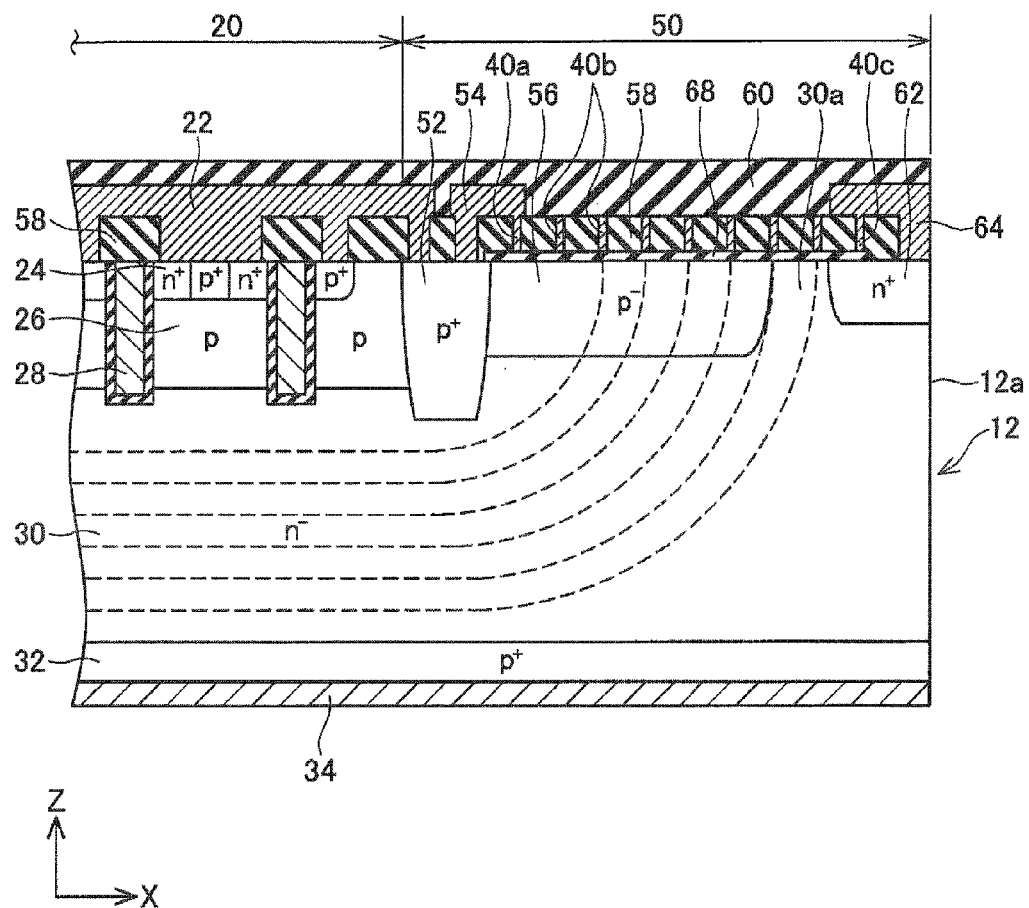
FIG. 9 is a longitudinal sectional view of a semiconductor device of a variation.

It should be noted that, in the above-described embodiment, the insulating layer 58 of $SiO_2$ is formed on the lower side of the trench electrodes 40. However, as illustrated in FIG. 9, the insulating layer 68 of SiN may be formed on the lower side of the trench electrodes 40. SiN and $SiO_2$ can be selectively etched. Thus, in the process of forming the trenches 70 in the insulating layer 58 of $SiO_2$, when the trenches 70 reach the insulating layer 68 of SiN, the etching does not progress any more. Therefore, formation of the trench 70 to a depth deeper than intended can be prevented. According to this configuration, management of etching time can be made more easily.

Figure 10:
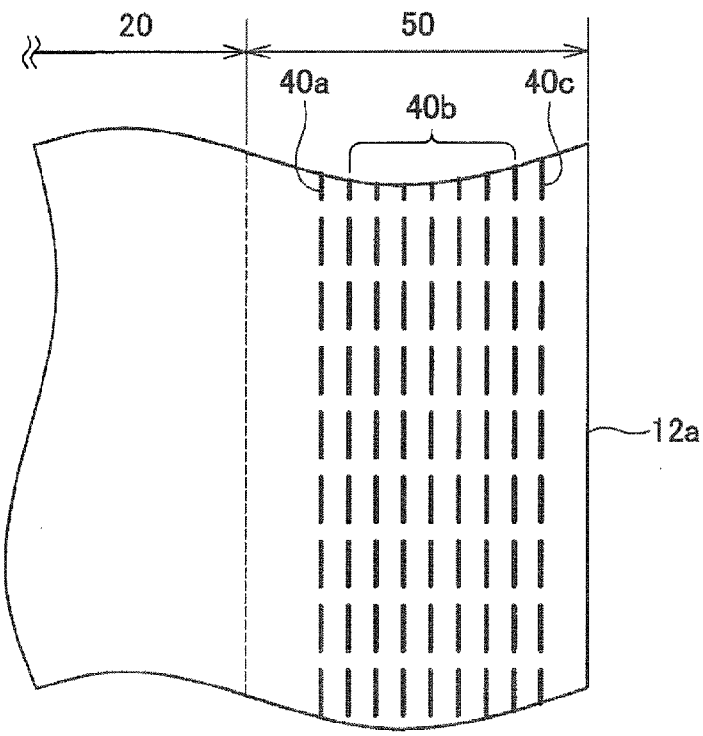
FIG. 10 is a view corresponding to FIG. 2 of a semiconductor device of a variation.
Figure 11:
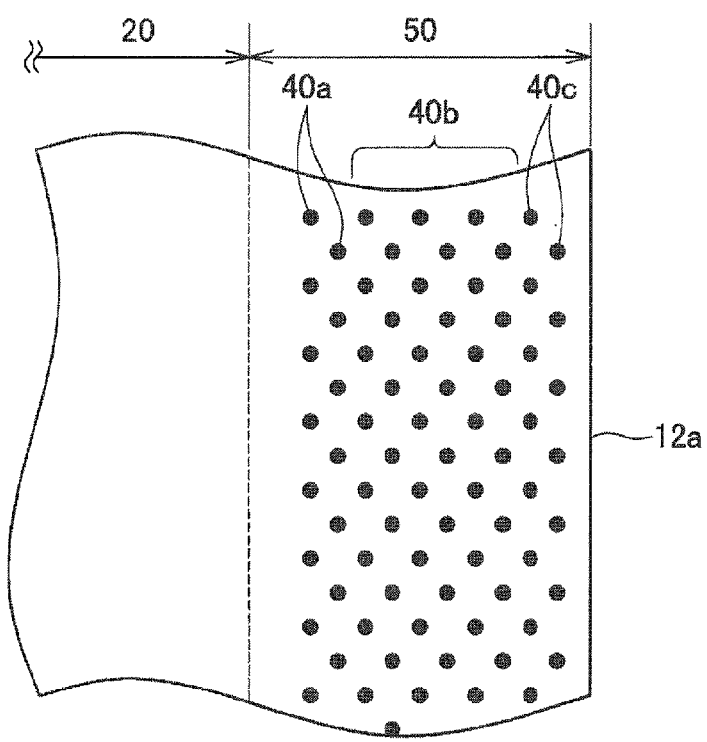
FIG. 11 is a view corresponding to FIG. 2 of a semiconductor device of a variation.

Moreover, in the above-described embodiment, the trench electrodes 40 extend long along the edge surface 12a as illustrated in FIG. 2. However, the trench electrodes 40 may extend in a broken line state as illustrated in FIG. 10. Alternatively, the trench electrodes 40 may be formed in a dot state as illustrated in FIG. 11. That is, the technical advantages of the embodiment can be obtained as long as the sectional structure illustrated in FIG. 1 is obtained at least in a part of the termination region 50.

Moreover, in the above-described embodiment, the IGBT is formed in the active region, but other semiconductor elements such as MOS-FET, diode and the like may be formed in the active region.

Second Embodiment

A semiconductor device 10a in the second embodiment will be explained with reference to FIGS. 12 and 13. The semiconductor device 10a of the second embodiment is obtained by changing a part of the semiconductor device 10 of the first embodiment. Therefore, a difference from the semiconductor device 10 of the first embodiment will be explained here. It should be noted that the same members as those in the semiconductor device 10 of the first embodiment will be given the same reference numerals, and detailed explanation will be omitted.

Figure 12:
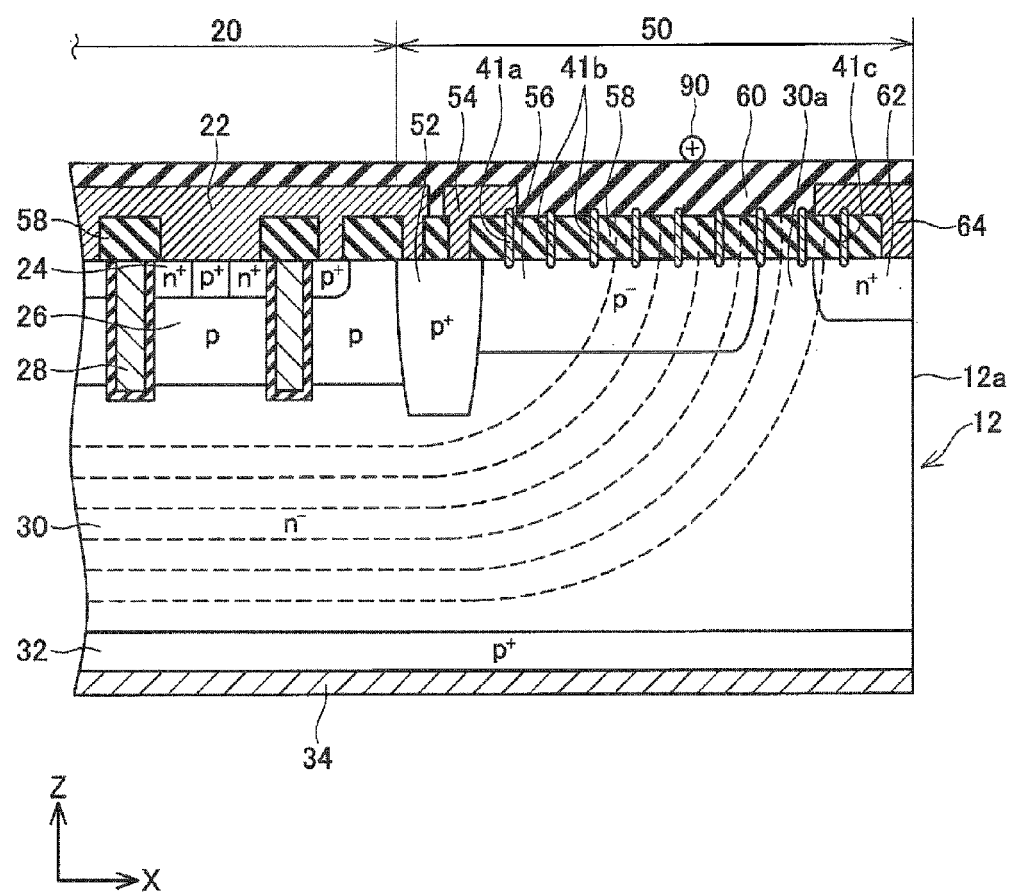
FIG. 12 is a longitudinal sectional view of a semiconductor device 10a of a second embodiment.

A cross section in FIG. 12 is a cross section along the direction from the active region 20 toward the edge surface 12a of the semiconductor substrate 12 (that is, an X-direction) and along the thickness direction of the semiconductor substrate 12 (that is, a Z-direction). The insulating layer 58, the insulating layer 60, and a plurality of trench electrodes 41 (41a-41c) is formed in the termination region 50. The trench electrodes 41 can be formed by a conductive material (polysilicon and the like, for example). In the cross section in FIG. 12, each of the trench electrodes 41 extends along the thickness direction of the semiconductor substrate 12. That is, each of the trench electrodes 41 has a width in the Z-direction greater than a width in the X-direction. Moreover, the width of each of the trench electrodes 41 in the X-direction is substantially equal. Each of the trench electrodes 41 is exposed on the upper surface and the lower surface of the insulating layer 58. In this embodiment, the upper parts of the trench electrodes 41a and 41c are located in the electrodes 54 and 64, respectively, which cover a part of the upper surface of the insulating layer 58, and the upper parts of the trench electrodes 41b are located in the insulating layer 60 formed on the upper surface of the insulating layer 58 and the upper surfaces of the electrodes 54 and 64. On the other hand, the lower parts of the trench electrodes 41 are located in the semiconductor layer. That is, each of the trench electrodes 41 is formed so as to penetrate the insulating layer 58 in the Z-direction.

Figure 13:
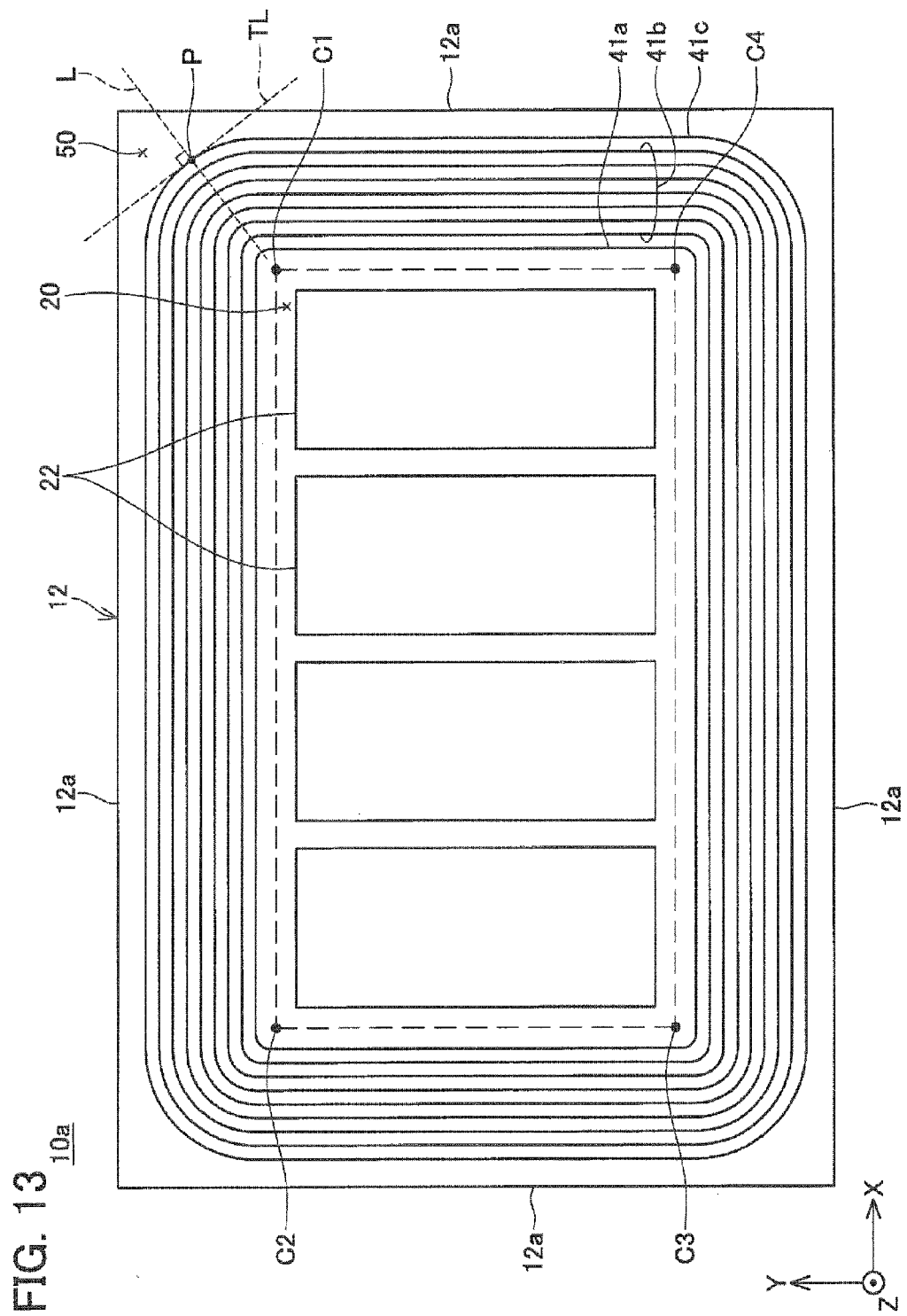
FIG. 13 is a plan view of the semiconductor device 10a of the second embodiment.

Moreover, as illustrated in FIG. 13, when the semiconductor substrate 12 is seen from the upper surface side, each of the trench electrodes 41 is formed so as to extend along the edge surface 12a of the semiconductor substrate 12 and to go around the active region 20. In a shape of a cross section (that is, a shape of the trench electrode 41 illustrated in FIG. 12) cut in a plane (a YZ plane or a ZX plane, for example) perpendicular to a longitudinal direction of the trench electrodes 41 (that is, a direction going around the active region 20), corners between the upper surface and a lateral surface of the trench electrode 41 and corners between the lower surface and the lateral surface of the trench electrode 41 have curved shapes. In other words, the cross section of the trench electrode 41 has a rectangular shape with its four corners rounded. When the semiconductor substrate 12 is seen from the upper surface side, at a position where the trench electrode 41 is curved with roundness at corners C1 to C4 of the rectangular active region 20, it should be noted that the above-described "plane perpendicular to the longitudinal direction" means the "plane perpendicular to a tangent at the position on the trench electrode 41". For example, a plane extending in the Z-direction including a line L orthogonal at a contact point P to a tangent TL at the contact point P corresponds to an example of the "plane perpendicular to the longitudinal direction". The trench electrodes 41 are arranged substantially at an equal interval along the X-direction of FIG. 12. Therefore, when the insulating layer 58 is cut in the plane perpendicular to the thickness direction of the semiconductor substrate 12 (that is, the XY plane), at least one trench electrode 41 is present on an arbitrary line from the active region 20 toward the edge surface 12a of the semiconductor substrate 12. Each of the trench electrodes 41 is electrically separated from each other. As illustrated in FIG. 12, the trench electrode 41a on a side the closest to the active region 20 is connected to the electrode 54. The trench electrode 41c on a side the closest to the edge surface 12a is connected to the electrode 64. The other trench electrodes 41b are not connected to other electrodes. Thus, a potential of each of the trench electrodes 41b is changed in accordance with potential distribution around it. That is, the trench electrodes 41b are floating electrodes. An upper surface of each of the trench electrodes 41b is covered by the insulating layer 60.

The semiconductor device 10a of the second embodiment exerts functions and effects similar to those of the semiconductor device 10 of the first embodiment. In addition, in the semiconductor device 10a of the second embodiment, the trench electrodes 41 are formed so as to penetrate the insulating layer 58 in the Z-direction. That is, in the insulating layer 58, a region between the adjacent trench electrodes 41 becomes a closed space in the X-direction in FIG. 12. Thus, the external electric charges and movable ions present in advance in the insulating layer 58 can move only in the closed space. As described above, the trench electrodes 41 physically shut off the movement of the external electric charges and movable ions. As a result, generation of a locally high electric field caused by the external electric charges and movable ions driven by heat or an applied voltage and moved in the insulating layer 58 toward the active region 20 side can be suppressed. Therefore, the semiconductor device 10a can ensure excellent withstand voltage properties. It should be noted that, in the trench electrodes 41 in this embodiment, it is needless to say that, in addition to the physical shut-off of the movement of the external electric charges and movable ions, generation of the locally high electric field can be suppressed also by forming a capacitor between the adjacent trench electrodes 41 and by moving the external electric charges and movable ions to one of the capacitors by the electric field between the capacitors and by fixing thereto. Moreover, in this embodiment, concentration of the electric field at the corners can be suppressed by making the corners of the trench electrode 41 curved, and a drop of initial withstand voltage can be suppressed. Furthermore, since the trench electrodes 41 of this embodiment are formed protruding from the upper surface and the lower surface of the insulating layer 58, they can be manufactured more easily than the manufacture in which the trench electrodes 41 are embedded in the insulating layer 58. It should be noted that, when the trench electrodes 41 are composed of polysilicon, they are composed of the same material as those of the other portions of the semiconductor device 10a (the gate electrode 28 and the like, for example). Thus, it is no longer necessary to prepare a new material for the trench electrodes, and a rise in a manufacturing cost can be suppressed.

Subsequently, a first variation to fourth variation of the second embodiment will be explained with reference to FIGS. 14 to 17. Semiconductor devices in the first variation to fourth variation are obtained by changing the structure of the termination region 50 of the semiconductor device 10a of the second embodiment. Therefore, FIGS. 14 to 17 illustrate only the termination region 50, and a difference from the semiconductor device 10a of the second embodiment will be explained. It should be noted that the same members as those in the semiconductor device 10a of the second embodiment are given the same reference numerals, and detailed explanation will be omitted.

First Variation

Figure 14:
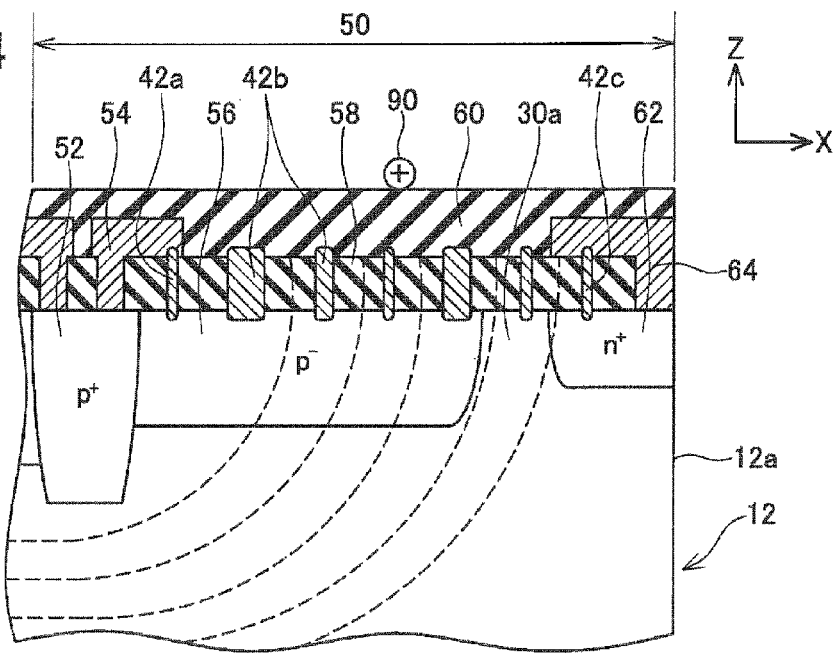
FIG. 14 is a partial enlarged view of a termination region 50 of a semiconductor device of a variation of the second embodiment.

As illustrated in FIG. 14, trench electrodes 42 (42a-42c) of the first variation are different from the trench electrodes 41 of the second embodiment in that widths in the X-direction are not the same. It should be noted that the trench electrodes 42 are arranged so that an interval between facing surfaces of the adjacent trench electrodes 42 is substantially equal. By this configuration, too, the semiconductor device of the first variation has functions and effects similar to those of the semiconductor device 10a of the second embodiment.

Second Variation

Figure 15:
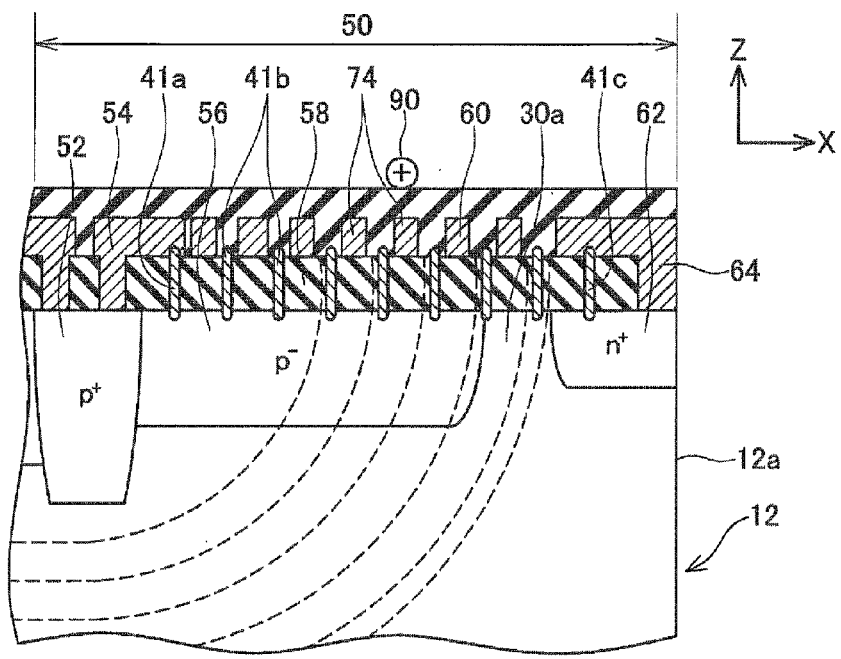
FIG. 15 is a partial enlarged view of a termination region 50 of a semiconductor device of another variation of the second embodiment.

As illustrated in FIG. 15, a semiconductor device of the second variation is different from the semiconductor device 10a of the second embodiment in that a plurality of electrodes 74 is formed on the upper surface of the insulating layer 58. The electrodes 74 are formed on the upper surface of the insulating layer 58 and arranged so as not to be in contact with the trench electrodes 41 protruding from the upper surface of the insulating layer 58. As a result, a capacitor is also formed between the adjacent electrodes 74. According to this configuration, adhesion of the external electric charges to the upper surface of the insulating layer 58 can be physically suppressed, and entry of the external electric charges into the insulating layer 58 can be electrically suppressed by the capacitor formed by the electrodes 74. Therefore, a drop of the withstand voltage caused by the external electric charges can be further suppressed. It should be noted that the electrodes 74 are composed of the same metal (aluminum, for example) as those forming the electrodes 54 and 64, but a substance forming the electrodes 74 is not limited to that. The electrodes 74 may be composed of polysilicon, for example.

Third Variation

Figure 16:
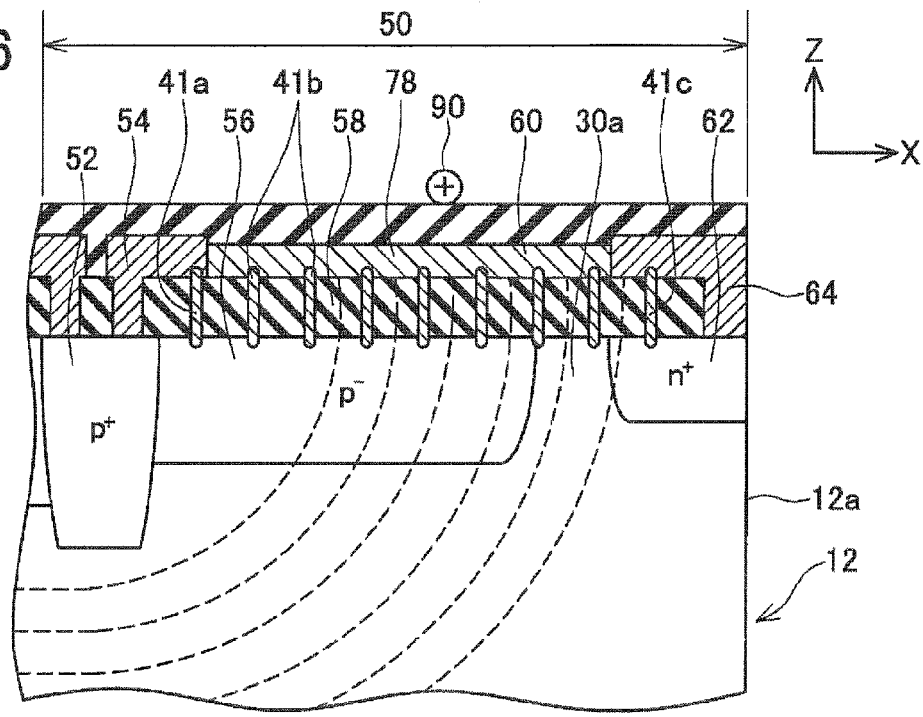
FIG. 16 is a partial enlarged view of a termination region 50 of a semiconductor device of another variation of the second embodiment.

A semiconductor device of the third variation is different from the semiconductor device 10a of the second embodiment in that a semiconductive silicon nitride film (so-called SInSiN film) 78 is formed on the upper surface of the insulating layer 58 as illustrated in FIG. 16. The semiconductive silicon nitride film 78 is located between the electrode 54 and the electrode 64, is in contact with the upper surface of the insulating layer 58, and is formed so as to be in contact with at least a part of one of lateral surfaces of the electrode 54 and with at least a part of one of lateral surfaces of the electrode 64. That is, the semiconductive silicon nitride film 78 is formed so as to cover the trench electrodes 41b and is connected to the electrodes 54 and 64. According to this configuration, adhesion of the external electric charges to the upper surface of the insulating layer 58 can be suppressed, and a drop of the withstand voltage caused by the external electric charges can be suppressed.

Fourth Variation

Figure 17:
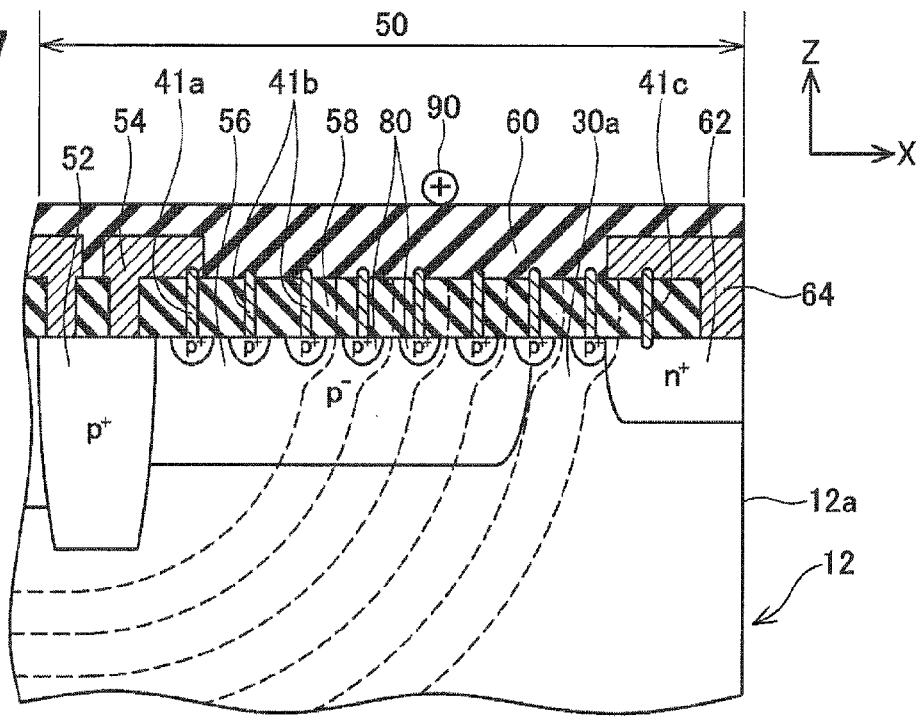
FIG. 17 is a partial enlarged view of a termination region 50 of a semiconductor device of another variation of the second embodiment.

As illustrated in FIG. 17, a semiconductor device of the fourth variation is different from the semiconductor device 10a of the second embodiment in that a plurality of p-type diffusion layers 80 is formed on lower parts of the trench electrodes 41. The p-type diffusion layers 80 are formed on lower parts of the trench electrodes 41a and 41b exposed at the resurf region 56 and the peripheral drift region 30a. That is, the p-type diffusion layer 80 is not formed on a lower part of the trench electrode 41c exposed at the end-portion n-type region 62. Impurity concentration of the p-type diffusion layer 80 is higher than p-type impurity concentration of the resurf region 56. According to this configuration, electric lines of force avoid the plurality of p-type diffusion layers 80 and pass to the surface side. Thus, corners on lower ends of the trench electrodes 41a and 41b do not have to be curved but may be substantially at a right angle, for example.

Third Embodiment

Subsequently, a semiconductor device 10b of the third embodiment will be explained with reference to FIG. 18. The semiconductor device 10b of the third embodiment is obtained by changing a part of the semiconductor device 10a of the second embodiment. Therefore, a difference from the semiconductor device 10a of the second embodiment will be explained here. It should be noted that the same members as those in the semiconductor device 10a of the second embodiment will be given the same reference numerals, and detailed explanation will be omitted.

Figure 18:
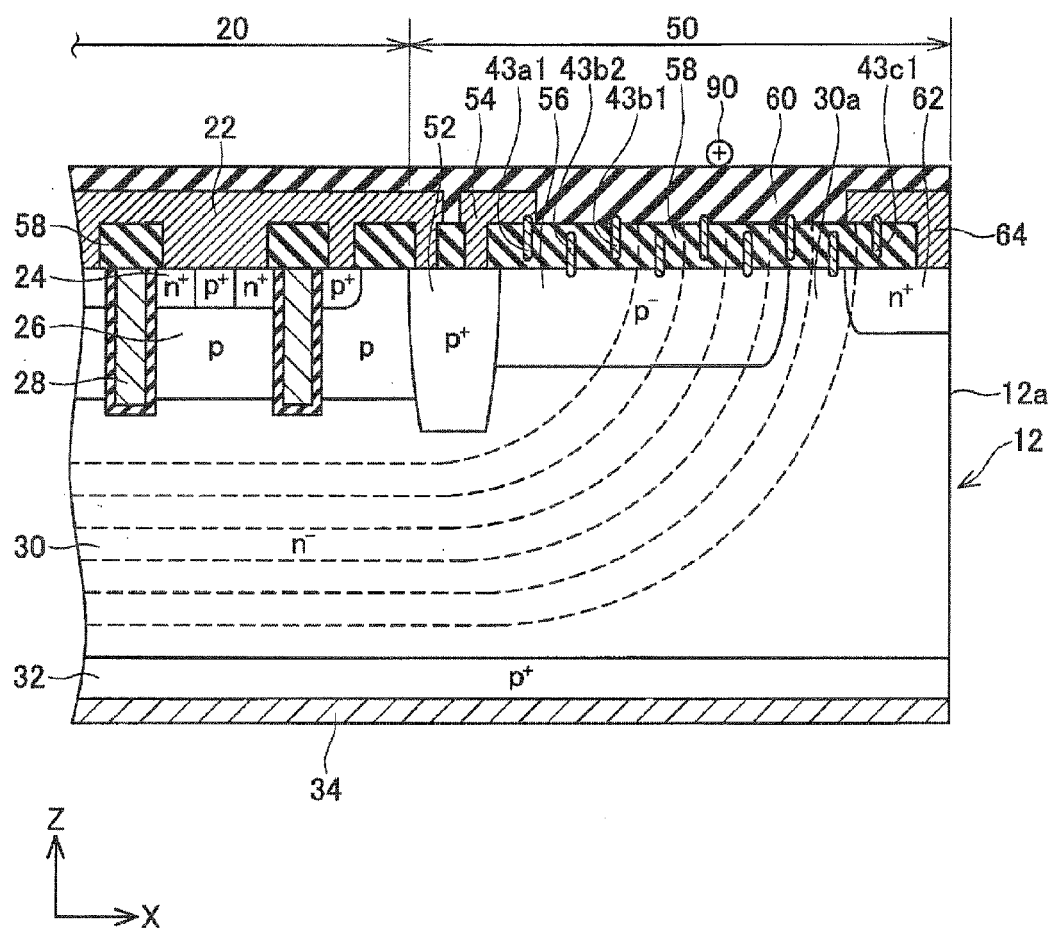
FIG. 18 is a longitudinal sectional view of a semiconductor device 10b of a third embodiment.

A cross section in FIG. 18, similar to FIG. 12, is a cross section along the thickness direction (that is, the Z-direction) of the semiconductor substrate 12. The insulating layer 58, the insulating layer 60, and a plurality of trench electrodes 43 (43a-43c) are formed in the termination region 50. Each of the trench electrodes 43 has a width in the Z-direction greater than a width in the X-direction. The width in the X-direction is the same in each of the trench electrodes 43. The trench electrodes 43 have upper trench electrodes 43a1-43c1 with their upper ends exposed on the upper surface of the insulating layer 58 and lower trench electrodes 43b2 with their lower ends exposed on the lower surface of the insulating layer 58. The lower ends of the upper trench electrodes 43a1-43c1 are located in the insulating layer 58, and the upper ends of the lower trench electrodes 43b2 are located in the insulating layer 58. The upper trench electrodes 43a1-43c1 and the lower trench electrodes 43b2 are arranged alternately in the X-direction. The plurality of upper trench electrodes 43a1-43c1 and the lower trench electrodes 43b2 are formed so as to satisfy the following condition. That is, on an arbitrary cross section obtained by cutting the insulating layer 58 in a plane perpendicular to the thickness direction of the semiconductor substrate 12, at least one trench electrode 43 is present on an arbitrary line in the direction from the active region 20 toward the edge surface 12a of the semiconductor substrate 12. In other words, there is no case in which the trench electrode 43 is not present on the above-described arbitrary cross section. The upper trench electrodes 43a1-43c1 correspond to an example of a "first floating electrode" and the lower trench electrodes 43b2 correspond to an example of a "second floating electrode".

Moreover, in a shape of a cross section (that is, a shape of the trench electrode 43 illustrated in FIG. 18) cut in a plane perpendicular to a longitudinal direction of the trench electrode 43 (that is, a direction going around the active region 20), similarly to the trench electrodes 41, corners between the upper surface and a lateral surface of the trench electrode 43 and corners between the lower surface and the lateral surface of the trench electrode 43 have curved shapes. The trench electrodes 43 are arranged along the X-direction in FIG. 18 and substantially at an equal interval. Each of the trench electrodes 43 is electrically separated from each other. As illustrated in FIG. 18, the upper trench electrode 43a1 on a side the closest to the active region 20 is connected to the electrode 54. The upper trench electrode 43c1 on a side the closest to the edge surface 12a is connected to the electrode 64. The other trench electrodes 43b1 and 43b2 are not connected to the other electrodes. That is, the trench electrodes 43b1 and 43b2 are floating electrodes. Upper surfaces of the upper trench electrodes 43a1-43c1 are covered by the insulating layer 60.

The semiconductor device 10b of the third embodiment exerts functions and effects similar to those of the semiconductor device 10 of the first embodiment. In addition, in the semiconductor device 10b of the third embodiment, the upper trench electrodes 43a1-43c1 and the lower trench electrodes 43b2 are arranged alternately. That is, the wider surfaces of the upper trench electrodes 43a1-43c1 and the lower trench electrodes 43b2 are faced with each other. Thus, a capacitance of a capacitor formed by the upper trench electrodes 43a1-43c1 and the lower trench electrodes 43b2 becomes high, and an electric charge amount accumulated in each capacitor increases. Moreover, the external electric charges moves to one of trench electrodes 43 by an electric field generated between the trench electrodes 43 and fixed thereto. Therefore, an influence of the electrical field of the external electric charges and movable ions can be effectively suppressed.

Subsequently, a first variation to a fifth variation of the third embodiment will be explained with reference to FIGS. 19 to 23. Semiconductor devices of the first variation to the fifth variation are obtained by changing the structure of the termination region 50 of the semiconductor device 10b of the third embodiment. Therefore, FIGS. 19 to 23 illustrate only the termination region 50, and a difference from the semiconductor device 10b of the third embodiment will be explained. It should be noted that the same member as those of the semiconductor device 10b of the third embodiment will be given the same reference numerals, and detailed explanation will be omitted.

First Variation

Figure 19:
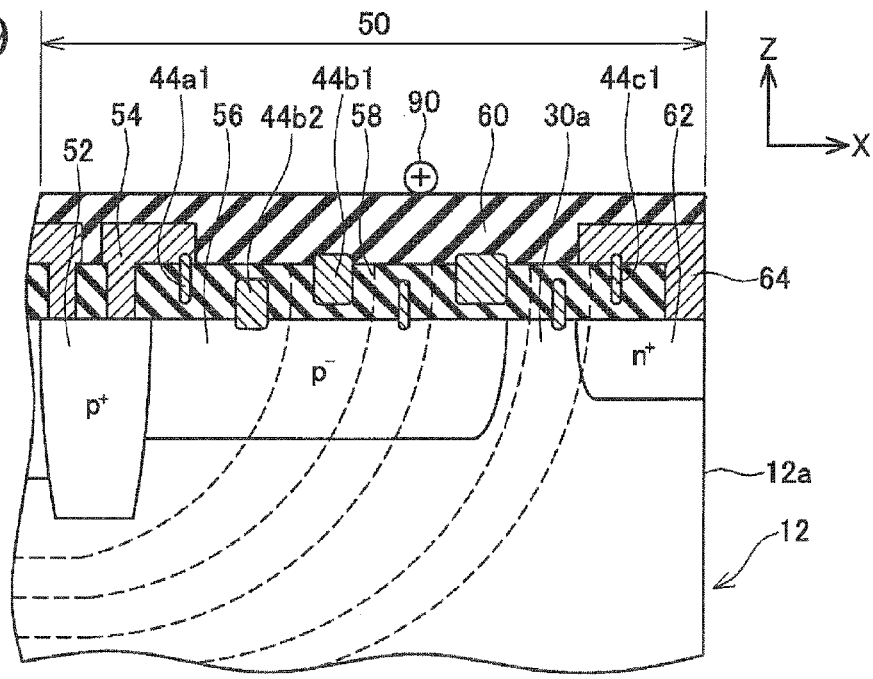
FIG. 19 is a partial enlarged view of a termination region 50 of a semiconductor device of a variation of the third embodiment.

As illustrated in FIG. 19, trench electrodes 44 (44a1-44c1, 44b2) of the first variation have widths in the X-direction individually different, which is different from the trench electrodes 43 in the third embodiment. In this case, too, the trench electrodes 44 are arranged so that intervals between the faced surfaces of the adjacent trench electrodes 44 become substantially equal. By this configuration, too, functions and effects similar to those of the semiconductor device 10b of the third embodiment can be exerted.

Second Variation

Figure 20:
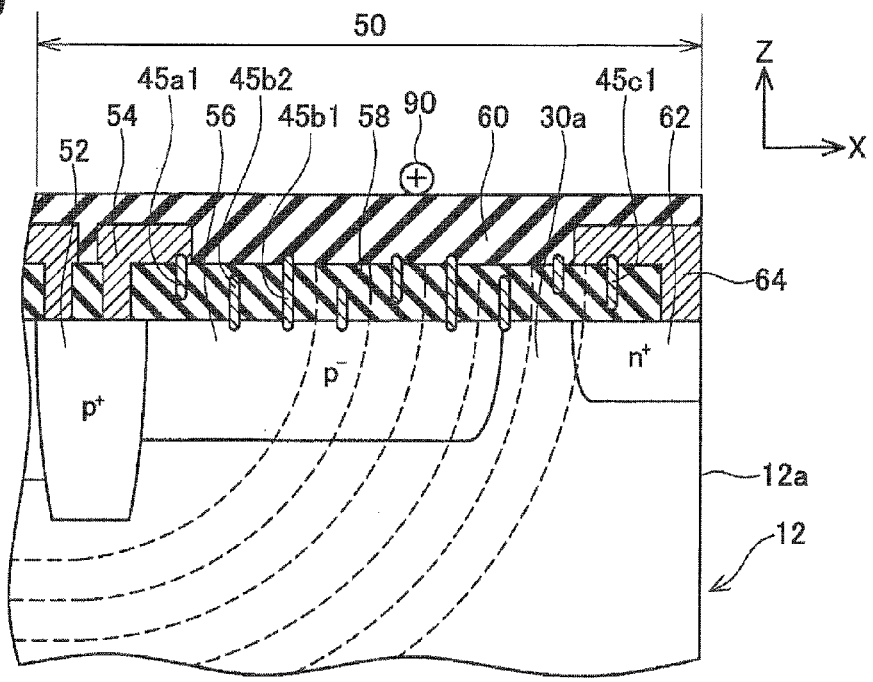
FIG. 20 is a partial enlarged view of a termination region 50 of a semiconductor device of another variation of the third embodiment.

As illustrated in FIG. 20, trench electrodes 45 (45a1-45c1, 45b2) of the second variation have widths in the Z-direction individually different, which is different from the trench electrodes 43 in the third embodiment. It should be noted that, in each of the trench electrodes 43, at least one of its upper end or lower end is exposed on the upper surface or the lower surface of the insulating layer 58, respectively. By this configuration, too, functions and effects similar to those of the semiconductor device 10b of the third embodiment can be exerted.

Third Variation

Figure 21:
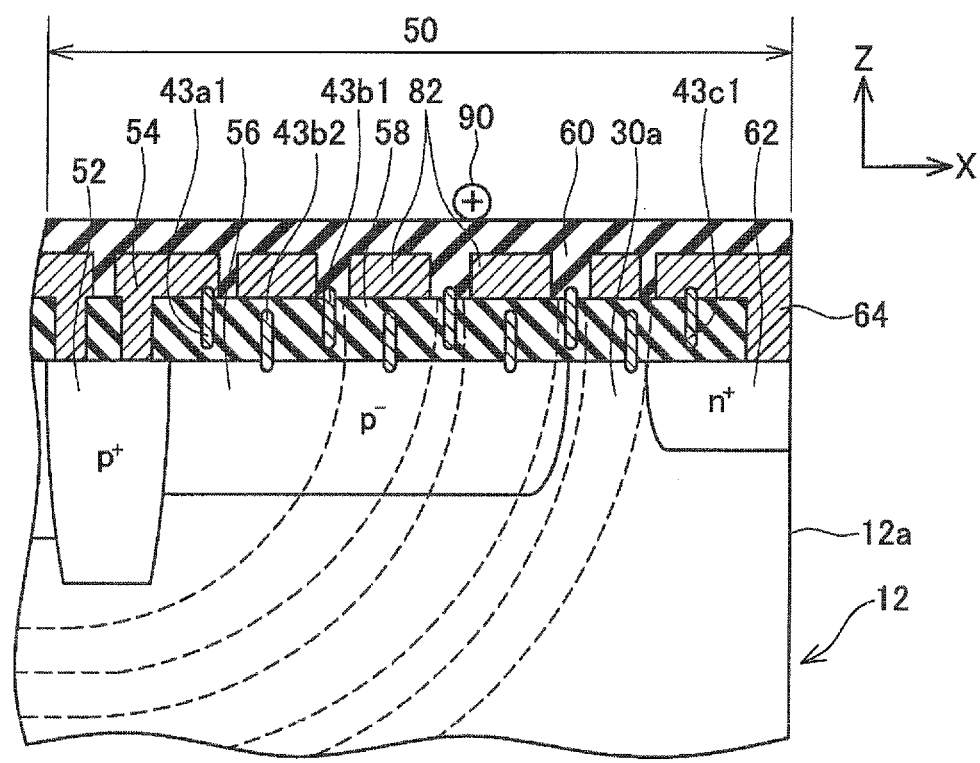
FIG. 21 is a partial enlarged view of a termination region 50 of a semiconductor device of another variation of the third embodiment.

As illustrated in FIG. 21, a semiconductor device in the third variation is different from the semiconductor device 10b of the third embodiment in that a plurality of electrodes 82 is formed on the upper surface of the insulating layer 58. The electrodes 82 are formed so as not to be in contact with the upper trench electrodes 43 protruding from the upper surface of the insulating layer 58. As a result, the adjacent electrodes 82 form a capacitor. According to this configuration, adhesion of the external electric charges to the upper surface of the insulating layer 58 is physically suppressed, and entry of the external electric charges into the insulating layer 58 can be electrically suppressed by the capacitor formed by the electrodes 82. Therefore, a drop of the withstand voltage caused by the external electric charges can be suppressed. It should be noted that the electrodes 82 are composed of aluminum, polysilicon or the like, for example, but a substance forming the electrodes 82 is not limited to that.

Fourth Variation

Figure 22:
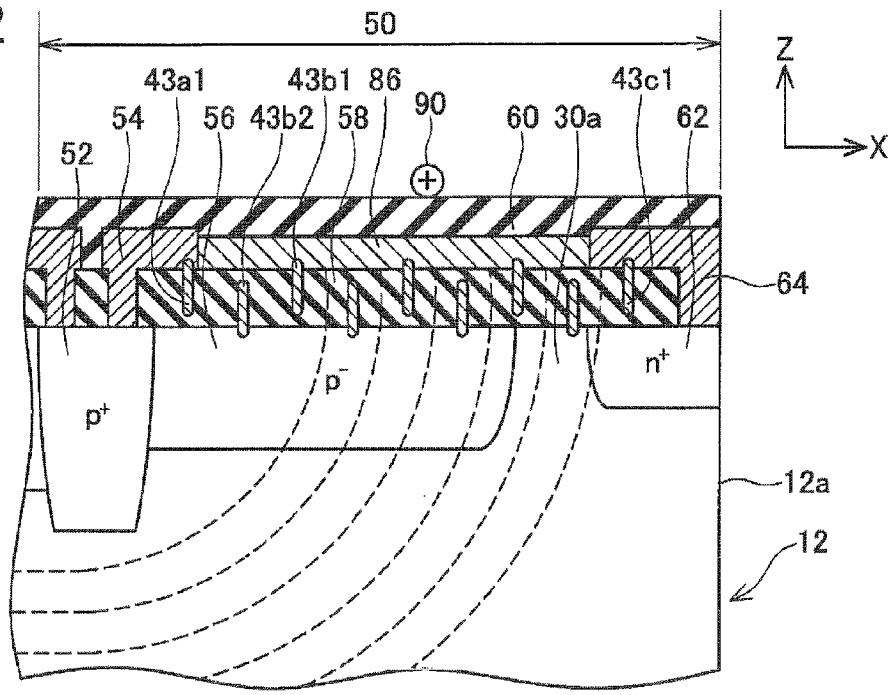
FIG. 22 is a partial enlarged view of a termination region 50 of a semiconductor device of another variation of the third embodiment.

As illustrated in FIG. 22, a semiconductor device of the fourth variation is different from the semiconductor device 10*b* of the third embodiment in that a semiconductive silicon nitride film (so-called SInSiN film) 86 is formed on the upper surface of the insulating layer 58. The semiconductive silicon nitride film 86 is located between the electrode 54 and the electrode 64 similarly to the variation illustrated in FIG. 16 and is formed so as to cover the upper trench electrodes 43*b*1. According to this configuration, adhesion of the external electric charges to the upper surface of the insulating layer 58 can be suppressed, and a drop of the withstand voltage caused by the external electric charges can be suppressed.

Fifth Variation

Figure 23:
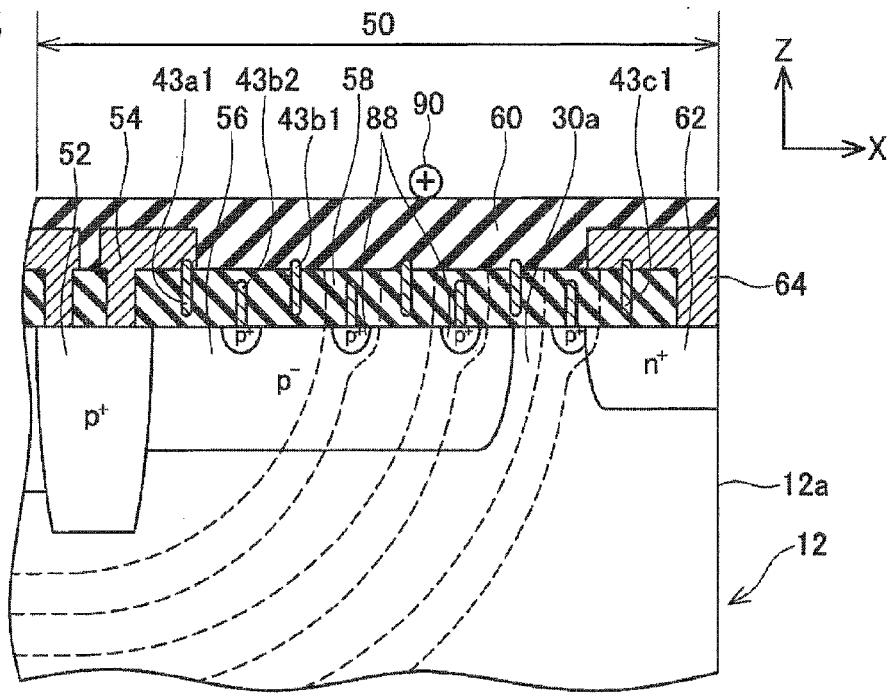
FIG. 23 is a partial enlarged view of a termination region 50 of a semiconductor device of the other variation of the third embodiment.

As illustrated in FIG. 23, a semiconductor device of the fifth variation is different from the semiconductor device 10*b* of the third embodiment in that a plurality of p-type diffusion layers 88 is formed on lower parts of the lower trench electrodes 43*b*2. The p-type diffusion layers 88 are formed on the lower parts of the lower trench electrodes 43*b*2 exposed on the resurf region 56 and the peripheral drift region 30*a*. Impurity concentration of the p-type diffusion layer 88 is higher than p-type impurity concentration of the resurf region 56. According to this configuration, electric lines of force avoid the plurality of p-type diffusion layers 80 and pass to the surface side. Thus, corners on lower ends of the trench electrodes 43*b*2 do not have to be curved.

Specific examples of the present invention have been described in detail, however, these are mere exemplary indications and thus do not limit the scope of the claims. The art described in the claims includes modifications and variations of the specific examples presented above.

For example, the corners on the section of the trench electrode in the Z-direction are all curved in the second and third embodiments, but at least the corners of the lower end of the trench electrode exposed on the lower surface of the insulating layer 58 are preferably curved. That is, the shapes of the corners on the upper end of the trench electrode exposed on the upper surface of the insulating layer 58 and the corners of the trench electrode located in the insulating layer 58 are not limited to a curved shape but may be substantially at a right angle, for example.

Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

The invention claimed is:

1. A method for manufacturing a semiconductor device, the method comprising:
    forming an insulating layer on a termination region of a semiconductor substrate, the termination region being between an active region in which a semiconductor element is formed and a part which is to be an edge surface of the semiconductor substrate;
    forming a plurality of trenches at an interval in the insulating layer along a direction from the active region toward the part which is to be the edge surface of the semiconductor substrate, wherein a width of each of the plurality of trenches in a thickness direction of the semiconductor substrate is greater than a width of each of the plurality of trenches in the direction from the active region toward the part which is to be the edge surface of the semiconductor substrate;
    forming a metal layer on the insulating layer; and
    etching the metal layer in a state where the metal layer above the plurality of trenches is not masked, such that the metal layer in each trench remains, and the metal layers in the respective trenches are separated from each other, wherein
    the insulating layer is formed also on the active region in the forming of the insulating layer,
    the method further comprises forming a contact hole in the insulating layer on the active region, which is performed prior to the forming of the metal layer, wherein
    the metal layer is formed also in the contact hole in the forming of the metal layer, and
    the etching of the metal layer is performed in a state of masking the metal layer on the contact hole.

2. The method for manufacturing a semiconductor device according to claim 1, wherein the forming of the plurality of trenches and the forming of the contact hole are performed by a common etching.

* * * * *